(12) United States Patent
Khan

(10) Patent No.: US 7,958,475 B2
(45) Date of Patent: Jun. 7, 2011

(54) SYNTHESIS OF ASSERTIONS FROM STATEMENTS OF POWER INTENT

(75) Inventor: Neyaz Khan, Plano, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 738 days.

(21) Appl. No.: 11/863,512

(22) Filed: Sep. 28, 2007

(65) Prior Publication Data

US 2009/0089725 A1 Apr. 2, 2009

(51) Int. Cl.
*G06F 17/50* (2006.01)
(52) U.S. Cl. ....................................... 716/109
(58) Field of Classification Search .................. None
See application file for complete search history.

(56) References Cited

U.S. PATENT DOCUMENTS

| | | | |
|---|---|---|---|
| 7,669,165 B2* | 2/2010 | Pandey et al. | 716/18 |
| 7,673,276 B2* | 3/2010 | Wang | 716/18 |
| 7,694,251 B2* | 4/2010 | Chandramouli et al. | 716/5 |
| 2007/0245285 A1* | 10/2007 | Wang et al. | 716/10 |

OTHER PUBLICATIONS

Savithri et al., "An Assertion based Technique for Transistor level Dynamic Power Estimation," Proc. of the 13th Int'l Conference on VLSI Design, 2000, 4 pages.*
Yu et al., "Assertion-Based Power/Performance Analysis of Network Processor Architectures," 2004 IEEE, pp. 155-160.*
Chen et al., "Automatic Trace Analysis for Logic of Constraints," Design Automation Conference, Jun. 2-6, 2003, pp. 460-465.*
Balarin et al., "Constraints Specification at Higher Levels of Abstraction," Proceedings of Sixth IEEE Int'l High-Level Design Validation and Test Workshop, Nov. 7-9, 2001, pp. 129-133.*

* cited by examiner

*Primary Examiner* — Leigh Marie Garbowski
(74) *Attorney, Agent, or Firm* — Schwegman, Lundberg & Woessner, P.A.

(57) ABSTRACT

A low power integrated circuit design verification method and tool for automatically synthesizing a set of low power assertions from statements of low power intent. The low power intent statements provide low power constraint information for an integrated circuit design. The low power assertions are automatically synthesized from the low power intent statements and may be used to monitor, check and verify power controller signals. The low power assertions may also be used to collect low power functional coverage data.

29 Claims, 4 Drawing Sheets

SYNTHESIS OF ASSERTIONS FROM STATEMENTS OF POWER INTENT

BACKGROUND

Power management implementation and verification are critical considerations in any integrated circuit design process. As power consumption in integrated circuits increases, chip reliability, quality and productivity are negatively impacted. The challenges of high power consumption require the introduction of low power reduction techniques, solutions and tools as integral parts of integrated circuit design implementation and verification flow processes.

Design implementation and verification flow processes often include the use of assertions to check design behavior and measure functional coverage. Assertions may be used to check the required and/or expected behavior of a design throughout the simulation process. Additionally, assertions are typically used to look for forbidden behavior or expected outcomes and check the functional coverage of a design. However, it is often unclear at what stage of the design process the assertions should be written and who should write them. Furthermore, generating assertions manually to monitor and check design behavior is frequently a complex, time-consuming and error-prone task.

SUMMARY

This disclosure describes a new approach to low power verification. A low power verification process and tool that automatically synthesizes low power assertions from statements of low power intent is provided. The statements of low power intent may be derived from a design specification that includes the power requirements and constraints pertinent to a specific integrated circuit design. The automatically synthesized assertions may be used by a design to monitor and check the timing, sequence, and functional relationships of specific power control signals as well as to verify the timing relationship between the power control signals and design components.

According to a disclosed class of innovative embodiments, there is provided a computer-implemented method of low power design verification comprising parsing a file which includes statements of low power intent, automatically synthesizing assertions from the statements of low power intent, and verifying low power design behavior using the automatically synthesized assertions.

According to a disclosed class of innovative embodiments, there is disclosed a computer program product for an integrated circuit design process, including a medium storing executable program code, the computer program product comprising code, which when executed, performs a computer-implemented method of low power design verification comprising parsing a file which includes statements of low power intent, automatically synthesizing assertions from the statements of low power intent, and verifying low power design behavior using the automatically synthesized assertions.

According to another disclosed class of innovative embodiments, there is disclosed a method of validating implementation aspects of a low power specification comprising detecting implementation requirements in a low power specification, automatically constructing a checker which corresponds to the implementation requirements, and verifying the implementation requirements by executing the checker.

According to a disclosed class of innovative embodiments, there is disclosed a computer program product for an integrated circuit design process, including a medium storing executable program code, the computer program product comprising code, which when executed, performs a method of detecting implementation requirements in a low power specification, automatically constructing a checker which corresponds to the implementation requirements, and verifying the implementation requirements by executing the checker.

According to another disclosed class of innovative embodiments, there is disclosed a design checker comprising means for automatically synthesizing power assertions from a statement of power intent, and means for verifying control and power mode relations using the synthesized power assertions.

Generating low power assertions manually to monitor and check design behavior is frequently a complex, time-consuming and error-prone task. The embodiments of the disclosed processes and tools provide the advantage of minimizing the need for skilled engineering time during the integrated circuit development process while producing an integrated circuit that is correct-by-construction. An additional advantage may include the increased accuracy of the functional verification coverage as the verification flow of the integrated circuit design process becomes more predictable and reliable.

These and other advantages will be more clearly understood from the following detailed description taken in conjunction with the accompanying drawings and claims.

BRIEF DESCRIPTION OF THE DRAWINGS

For a more complete understanding of the disclosure and the advantages thereof, reference is now made to the accompanying drawings wherein similar or identical reference numerals represent similar or identical items.

DETAILED DESCRIPTION OF THE PREFERRED EMBODIMENTS

The numerous innovative teachings of the present disclosure will be described with particular reference to presently preferred embodiments. The disclosure should in no way be limited to the implementations, drawings, and techniques illustrated and described herein, but may be modified within the scope of the appended claims along with their full scope of equivalents.

In embodiments of this disclosure, an Automatic Power Assertion Generator (APAG) is an integral part of a verification environment in an integrated circuit (IC) design low power design flow. APAG may extract and input the low power intent of an IC power-aware specification and based on the low power intent extracted, APAG automatically synthesizes and outputs low power assertions. The low power assertions may then be used throughout the low power design flow process to verify or check the low power design performance or behavior of a device.

Figure 1:
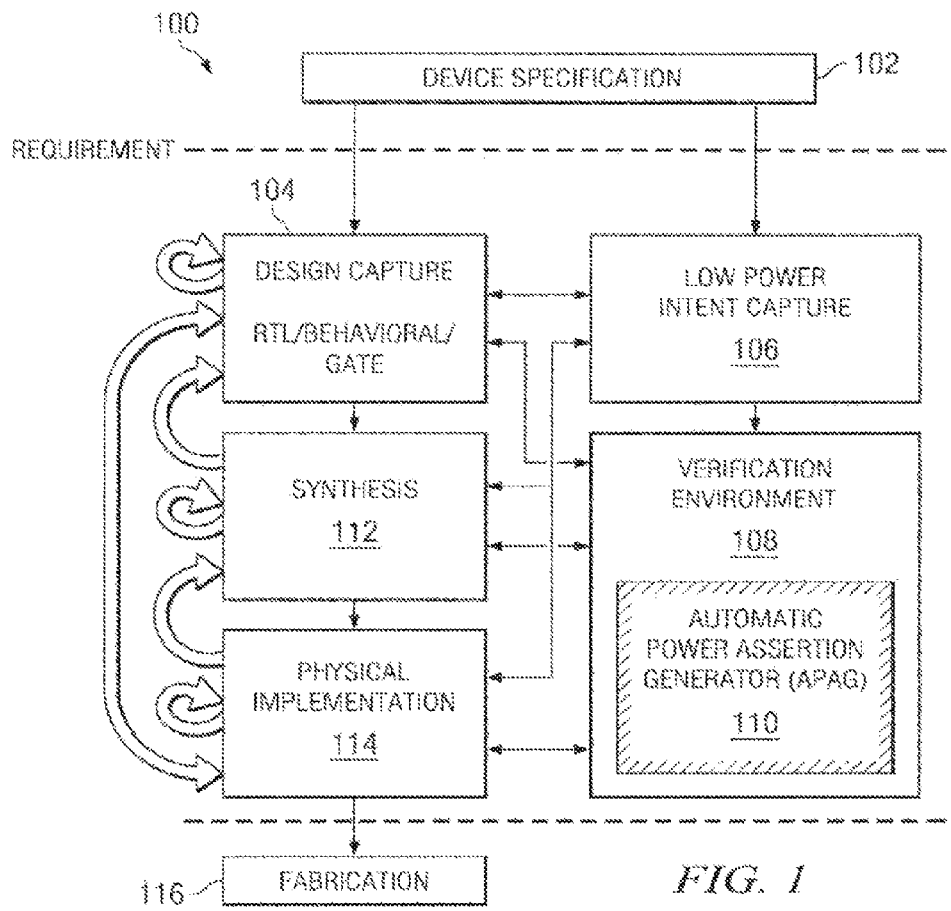
FIG. 1 is a high-level design flow diagram according to one embodiment of the current disclosure.

FIG. 1 is a schematic diagram that illustrates one embodiment of an IC low power design flow 100. Low power design flow 100 begins with the creation or definition of a device specification 102. The specification 102 includes architectural and power-aware requirements. Power-aware requirements are important to power management and provide criteria for maintaining the power consumption of a device within a designated range. The architectural and power-aware requirements may include information relating to function, timing, area and power. The requirements may also include constraint information and yield, power, or other target information. The specification 102 provides input for the design capture 104 stage and the power intent capture 106 stage. The power-aware specification may define a device, System-On-Chip (SOC), microarchitecture, software implementation or other type of design that may be obvious to one skilled in the art.

The design capture 104 process is enabled to create a design based on the device specification requirements. During design capture 104, the chip architecture and functional blocks may be created. Design capture 104 may support various levels of abstraction. For example, a design may be created using Register Transfer Language (RTL), a behavioral language, such as a Hardware Description Language (HDL), VHSIC Hardware Description Language (VHDL), Verilog, System C, C++, or any other behavioral language that may be obvious to one skilled in the art. Design capture 104 may also support a gate level format through the use of gate-level schematic entry or other gate level tool and may additionally support the use or reuse of existing intellectual property (IP). The design capture process 104 could also encode or incorporate power intent information in order to determine the architecture necessary to meet the device specification 102 targets and requirements.

The power intent capture 106 processes extracts the power intent from the device specification 102. The power intent defines the low power implementation requirements and constraints of a power-aware device. Devices that are power-aware usually include architectural constructs, constraints or techniques that control device power consumption. The power implementation requirements may include information regarding power-up and power-down sequences, power networks, power domains, level shifter information, power retention states, power isolation information and any other such power considerations important in low power design systems. Low power design systems may include firmware, embedded processors and custom-coded state machines. The power intent capture 106 may extract the power implementation requirement information into a separate power specification. The power specification may be a standardized power aware format such as common power format (CPF), unified power format (UPF) or some other power specification format capable of expressing power intent.

The power specification could also include certain keywords that are format and device dependent. Table 1, shown below, features a subset of keywords for the power controller design in a particular power aware format: create_power_domain, create_isolation_logic, and create_state_retention_logic. It must be noted that the type and number of keywords used for a design will vary based on the type of design and standardized power format used to express low power behavior. In Table 1, the keywords are followed by argument and identification of the power controller design signals: iso_en, power_shutoff, and !save_en.

The design specification and power specification are used by a verification environment 108. The verification environment 108 may include tools or processes that handle verification coverage, formal analysis, functional and structural checks, acceleration and emulation, testbench automation and test stimulus generation. Other verification tools or processes may be used within the verification environment and these would be apparent to one of ordinary skill in the art. In one embodiment, the verification environment 108 includes APAG 110. APAG 110 may input the power intent and output assertions that are used during verification processes, such as formal analysis or simulation, to check design behavior.

The verification environment operates on the design and power intent specification to verify functional, timing, and power targets set by the device specification 102. It is important to note that the verification environment is an iterative part of design flow 100 and may be used after each stage in the design process to verify results or compare the results to a previous stage. As results are verified and compared, the process of a stage may be iterated or a previous stage may be repeated. One or more rounds of verification may be performed throughout the design flow 100 to ensure the production of a working and reliable product or prototype at the fabrication stage 116.

Another stage in the low power design flow 100 is synthesis 112. The synthesis 112 stage of design flow 100 translates and maps the design output from design capture 104 into gate-level. In some embodiments, the gates used may be generic or specific to a vendor library. The results of the synthesis 112 stage may be verified by the verification environment. The synthesis act may be repeated as a result of the verification act or the design capture may be repeated.

Many scenarios exist where iteration within the design flow may occur. For example, there could be one scenario where a behavioral level design is verified and output from design capture 104 and synthesized into gate level. The gate level may then be functionally verified in the verification environment 108 and compared to the previous functional verification. If the comparison is inadequate or fails, the process may iterate back to design capture 104 where the behavioral level design may be edited or refined. The process may then iterate back through synthesis 112 and the verification environment 108.

Low power design flow 100 also includes physical implementation 114. Physical implementation 114 involves processes such as prototyping, design for test (DFT), test mode scheduling, automatic partitioning of power domains, routing, and synthesis. Other processes may be required by physical implementation and these would be known to one of ordinary skill in the art.

Figure 2:
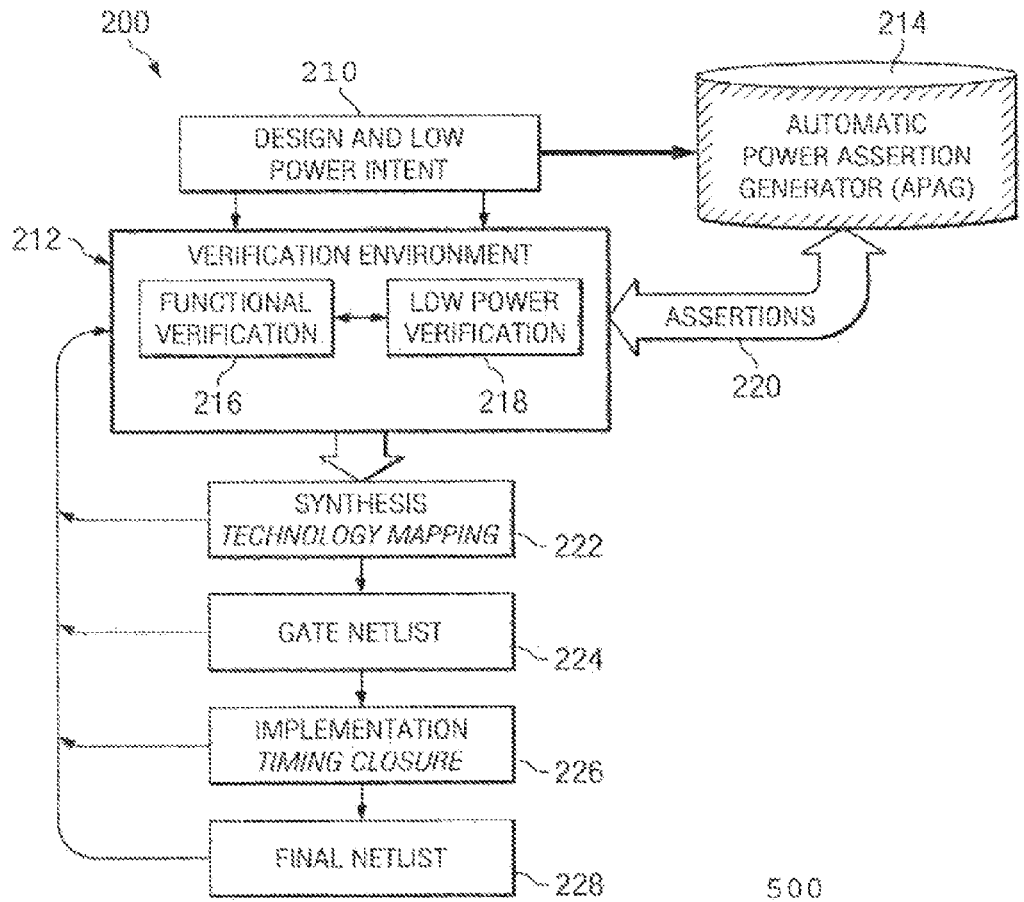
FIG. 2 illustrates a diagram detailing the design flow of the automatic power generation process.

In another embodiment, FIG. 2 is a top level diagram that illustrates the role of APAG 214 in a low power design flow methodology 200. The design intent and low power intent 210 are verified by a verification environment 212. The design intent may express the logical and functional design requirements, targets or objectives, considerations and constraints that are pertinent to a design. The low power intent expresses the requirements and considerations pertinent to the implementation of dynamic and static power in a low power design.

The tools and processes of the verification environment 212 may be operable to perform functional verification 216 processes based on the design intent input and also to perform low power verification 218 processes based on the low power intent input. Low power intent verification would be performed for the various power modes and power domain implementations that may be specified for a device. The verification of low power intent could include, but is in no way limited to, verification of the power supply within each power domain, verification of power states, such as power-up or power-down, verification of the behavior of power signals while being driven or quiescent, verification of level shifter logic operation, verification of isolation logic operations, verification of clock gating, verification of power modes, multi-supply voltages (MSV), and dynamic voltage and frequency scaling (DVFS). Other low power intent verifications may be targeted as would be obvious to one of ordinary skill in the art.

APAG 214 accepts low power intent information and automatically generates or synthesizes low power assertions 220 that may be used for the low power verification 218 processes of a low power design. APAG 214 may be configured to process low power intent information that relates to power aware design elements such as power switches, power regulators, power controllers, level shifters, isolation elements, and other similar power management elements that would be obvious to one of ordinary skill in the art.

In one embodiment, APAG 214 processes the low power intent information contained in the power specification pertaining to a power controller that generates power control signals. The power control signals may include power shut-off (PSO), power retention (RET), and power isolation (ISO) signals that control power management modes for power shut-off/power on, power retention, power isolation, and power sequencing. APAG 214 would input the portion of the power specification pertinent to power controller management and synthesize or generate assertions 220 based on the power specification input to check the behavior and sequence of power controller signals. Controlling PSO is a highly effective low power management technique. However, PSO requires the scheduling and verification of a strict functional or operational sequence between the power control signals PSO, RET, and ISO. The power controller operational sequence will be further explained later in this disclosure.

After verification, synthesis 222 and mapping of the design to a gate netlist 224 occurs. The gate netlist 224 output may iterate through the functional verification and the low power verification of the verification environment. After the gate netlist is obtained and verified, physical implementation 226 and verification commences. Physical implementation generally includes, but is not limited to, timing closure, constraint verification, chip integration, prototyping, equivalence checking, physical synthesis and analysis. A final netlist 228 is produced and may also be subject to verification. Iteration within the verification environment may involve the re-synthesis of assertions and changes to the functional or low power specification.

Figure 3:
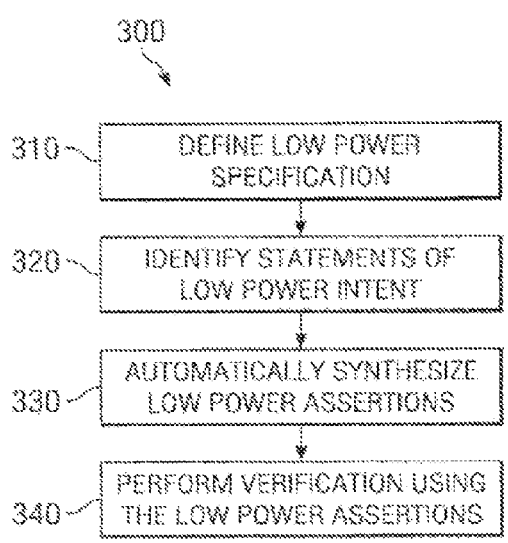
FIG. 3 is a top level flowchart detailing the design flow of the automatic power assertion generator.

FIG. 3 provides a top level flowchart of the APAG design flow 300 according to one embodiment. Design flow 300 commences with defining a low power specification 310 for a device. The low power specification specifies the power intent of a design and provides the power profile for a device. The power profile may include power information relating to multiple power domains, power states, and power supplies. The power specification may be implemented in a design and verification tool-compatible format such as CPF or UPF or other compatible format that may be well known to one of ordinary skill in the art. The format may use declarations, statements, variables, or a combination of these. In one embodiment the power specification includes information relating to a power controller.

At block 320, statements of low power intent are identified. In one embodiment, the statements of power intent identified in the low power specification could define power controller requirements and include power signals such as power shut-off, power retain, power isolate, and power control parameters including power modes.

At a block 330, the statements of low power intent that are identified are automatically synthesized by the APAG into low power assertions. At a block 340, the assertions may be used in a verification environment to check functionality, behavior or a specific sequencing routine during formal simulation, synthesis, simulation, emulation or other processes that may be recognized by one having ordinary skill in the art. In a preferred embodiment, the power assertions may specify or relate to one or more power management options, that may include, but is in no way limited to, power controller sequencing, power controller on/off, power modes, MSV and DVFS. The assertions may then used in the verification environment to check design behavior at various stages of simulation, synthesis and implementation.

Figure 4:
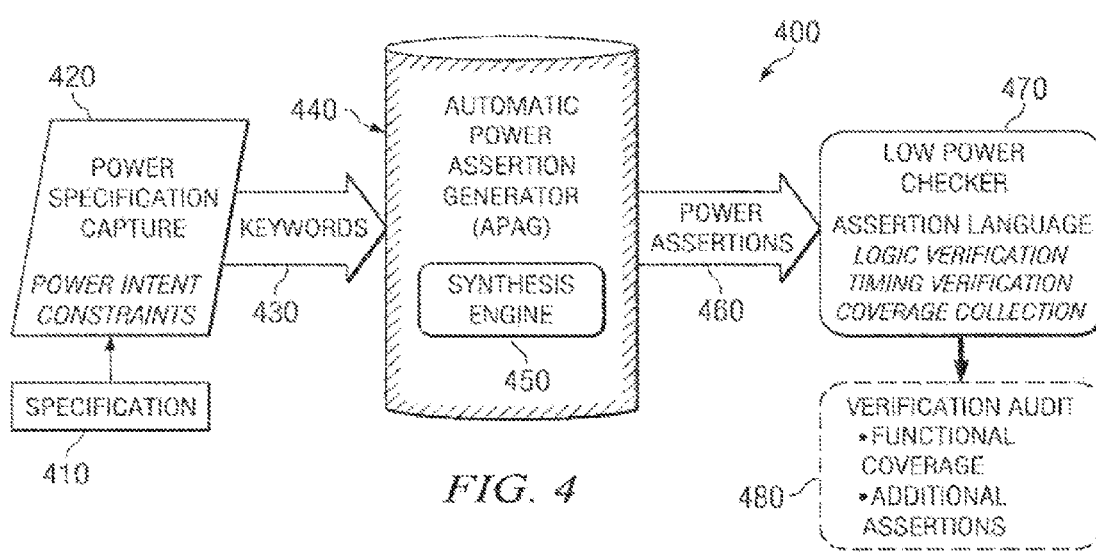
FIG. 4 illustrates an implementation model detailing the operation of the automatic power generation method.

FIG. 4 depicts a detailed implementation model 400 of a preferred embodiment of the APAG process. Process 400 starts from a specification 410 that details the design and power intent of a power-aware device. The power intent is captured in a power specification at 420 having a specific format. The format may include statements that express low power intent or low power behavior. In a preferred embodiment, APAG 440 may analyze and identify sections of the power specification that details power controller design elements. It must be noted that power design elements may also include clock and reset generators.

Table 1, inset below, shows an exemplary power specification that defines the low power design intent requirements of a power controller design.

TABLE 1

```
1  #Define top level design
2  set_top_design tb_top_ver.dut
3  #Specify top level power domain
4  create_power_domain-name top-default
5  #Add isolation logic to the primary output-dout [13:0]
6  create_isolation_logic-from top\
7           -isolation_condition{iso_en}\
8           -isolation_output low\
9           - pins {dout*}
10 #Create a power domain, and retention logic in the
   pipeline register
12 create power_domain -name pipeline\
13          -shutoff_condition {power_shutoff}
14          -instances {fir 31. Pipeline}
15 Create_state_retention_logic_restore_edge {! save_en}\
            -instance {fir 31. Pipeline}
```

In Table 1, a tag "#", at lines 1, 3, 5, and 10, denote comment lines that provide additional information about the command lines of the power specification. The power specification may include certain keywords that are format dependent. The power specification may also include signals that are device specific. Table 1 features a subset of keywords that may be pertinent to a power controller design: create_power_domain, create_isolation_logic, and create_state_retention_logic. It must be noted that the type and number of keywords used in a power specification design will vary based on the type of design and standardized power format used to express low power behavior. In Table 1, the keywords are followed by argument denoted by a dash "-". The power controller design signals that enable functions of isolate, iso_en, power shut-off, power_shutoff, and retain, !save_en are specified at lines 7, 13 and 15.

The synthesis engine 450 of APAG 440 parses the power specification and identifies and extracts keywords 430. Based on the keyword extracts 430 identified, the APAG 440 synthesis engine 450 may determine the power signals for the specific power controller used in the power specification. The synthesis engine 450 uses the keyword extracts 430, the power signals, and other information that may be input from the power specification to generate or synthesize power assertions. The resulting low power assertions 460 that are output by the synthesis engine 450 could be represented by temporal, logical or Boolean expressions. The output low power assertions 460 may be triggered when a violation of the assertion expression occurs.

For example, one low power assertion that may be generated could express that when a design block shuts off, the isolation signal should go active. If this does not occur in the sequence specified by the assertion, then the assertion will trigger to indicate this error. Generally, low power assertions 460 may be collectively used to verify low power design behavior such as functional correctness, integrity, robustness, and overall power control of a device. Other types of low power assertions may be used as will be understood by those possessing an ordinary skill in the pertinent arts.

In a preferred embodiment, the output power assertions 460 are incorporated into a low power checker 470. The low power checker may be written in an assertion language such as Property Specification Language (PSL), SystemVerilog (SVA), or other similar language capable of expressing and implementing assertion based checks and coverage. The checker inputs the power assertions from the APAG process and may invoke machine or automated instructions that monitor whether an assertion fires or triggers. An assertion may fire or be triggered by a condition in the design that fails verification. Assertion based coverage data may be collected when an expected sequence or combination of control conditions are met.

Table 2, inset below, shows an output of the APAG synthesis engine 450 using Table 1 as input. The output in Table 2 may be expressed in an exemplary assertion language and details the assertions, that will check the behavior, functionality, and sequencing of the power controller signals isolate, iso_en, power enable, power_shutoff, and retain, !save_en.

It must be emphasized that the assertion language in Table 2 is merely exemplary and assertions may be expressed in other languages that may be known to one of ordinary skill in the art. Comment text, indicated by delimiters "//" summarize the processing that is executed by the assertions. For example, in Table 2, a comment at line 4 summarizes the assertion of lines 5-7 that checks that an isolation signal is activated a number of clock cycles prior to power shut-off. Another comment at line 8 summarizes the assertion of lines 9-11 that an isolation signal must hold steady during power shut-off. Table 2 also illustrates exemplary assertions that check the power down cycle sequence at lines 24-27 and the power up cycle sequence at lines 28-31.

TABLE 2

```
1  vunit top_ver (top_ver)
2  {
3    Default clock= (posedge clk);
4    // Isolation must occur before Power- Off
5    PwrAsrt_Iso_before_PowerOff: assert always (
```

TABLE 2-continued

```
6    {! iso_en; iso_en} |-> (power_shut off before! iso_en)
7  );
8  //Isolation must hold steady until power off
9  Pwr Asrt_hold_Iso_unit_Poweroff: assert always (
10   {! iso_en; iso_en} |-> (power_shut off)
11 );
12 //Isolation must hold steady during power off
13 Pwr Asrt_hold_Iso_during_Poweroff: assert always (
14   {! iso_en; iso_en [*]; power_shutoff} |->
     (iso_en until! power_shut off)
15 );
16 //Isolation must hold steady during power off
17 Pwr Asrt_hold_Iso_after_Power on: assert always (
18   {! power_shutoff; power_shutoff} |-> {iso_en [*]}
19 );
20
21 //Power Off never occurs in same clock-cycle that Isolation occurs in
22 Pwr Asrt_Never_Iso_and_Power Off: assert always (
23   {! Iso_en; iso_en} |->! power_shutoff
24            );
25
26 //Power Down cycle
27 PwrAsrt_PowerDown_cycle: assert always (
28   {! iso_en; iso_en} |=> {power_shutoff [*]}
29 );
30 //Power Up cycle
31 PwrAstr_PowerUp_cycle: assert always (
32   {power_shutoff;! power_shutoff} |-> {iso_en [*]}
33 );
34 //Full Power cycle
35 PwrAstr_Full PowerCycle: assert always (
36
37   {iso_en; iso_en[*2:5]; power_shutoff} |-> {iso_en[*];! iso_en}
38 );
39 }
```

Implementation model 400 may also include a verification audit 480. The verification audit may provide information about whether additional assertions are required, determines whether a complete set of stimuli exists, and checks for functional correctness and missing functional coverage.

Figure 5:
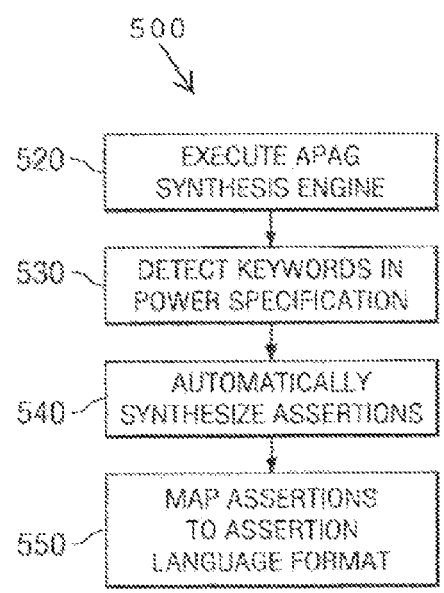
FIG. 5 is a flow diagram detailing the verification process according to one embodiment of the current disclosure.

FIG. 5 provides a detailed flowchart 500 of a method that may correspond to the process of FIG. 4. The method begins at block 520 with the execution of a synthesis engine. In some embodiments, the synthesis engine may comprise a parser that analyses a power specification and extracts keywords or other text portions of the power specification. The parser may be a compiler or some other tool or process that is capable of accepting and manipulating the input from the power specification. The synthesis engine may be software based and could comprise script code that executes to perform parsing of the power specification and synthesis of the power assertions. The synthesis engine may also include preprocessing and quality checks.

At block 530, the synthesis engine detects and extracts any keywords in the power specification. In one embodiment, the keywords provide information about the power domains and power modes of a power controller. The keywords may include statements such as create_power_domain, create_state_retention_logic, and create_isolation_logic. The keywords are followed by arguments which provide conditions and power signal names that require verification or monitoring. The arguments are subsequently used by the synthesis engine in the automated synthesis of power assertions. Table 1, illustrated above, provides examples of keywords and arguments. It must be noted that the keywords and arguments used may be design dependent and also dependent on the specific format used for the specification. The keywords could also pertain to power modes and other DVFS related information.

At block 540, the synthesis engine of the APAG automatically synthesizes and outputs a family of power assertions that are mapped into an assertion language format at a block 550 that forms the basis of a checker. The assertion language may be PSL or SVA or some other language capable of expressing and executing assertion constructs.

Figure 6A:
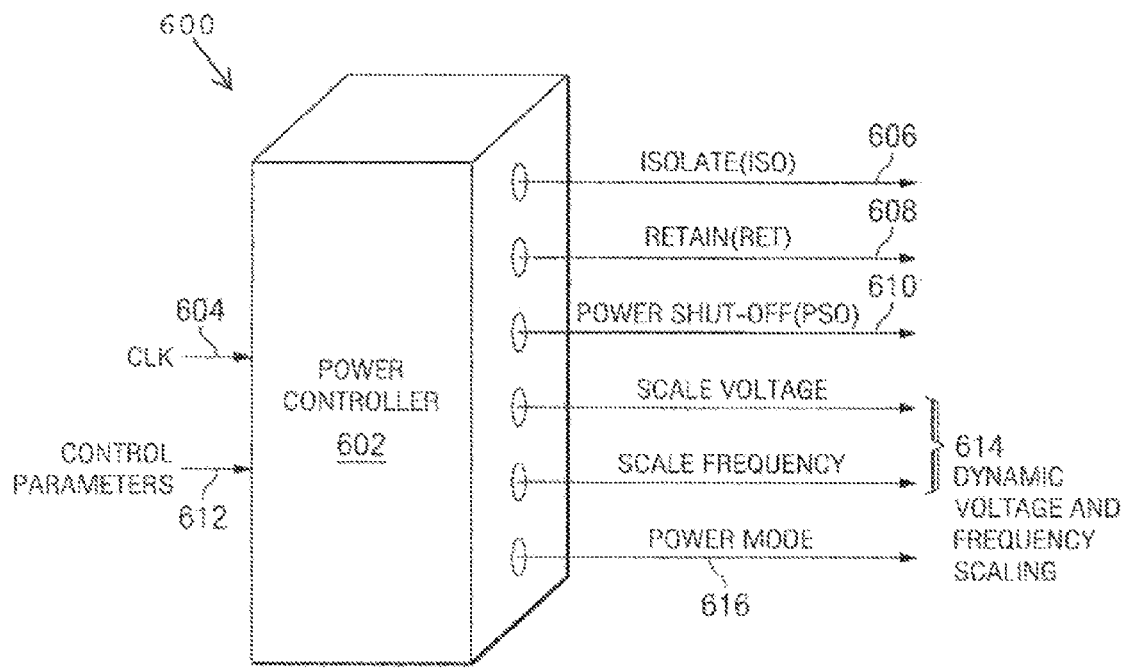
FIG. 6A is a diagram of an exemplary power controller that may be used in implementing embodiments of the current disclosure.

FIG. 6A illustrates a power controller block diagram 600 which could use the APAG process in design and verification. In an embodiment, power controller 602 includes clock input 604 and the output signals isolate (ISO) 606, retain (RET) 608, and power shut-off (PSO) 610. Power controller 602 may also input control parameters 612. The APAG method would verify the functionality, transitions, and sequence of the power controller signals and modes. Power controller 602 may also feature other output signals such as DVFS signals 614, including scale voltage and scale frequency, and power mode control signals 616. Other power control inputs and outputs are possible as will be well-recognized by one having ordinary skill in the art.

Figure 6B:
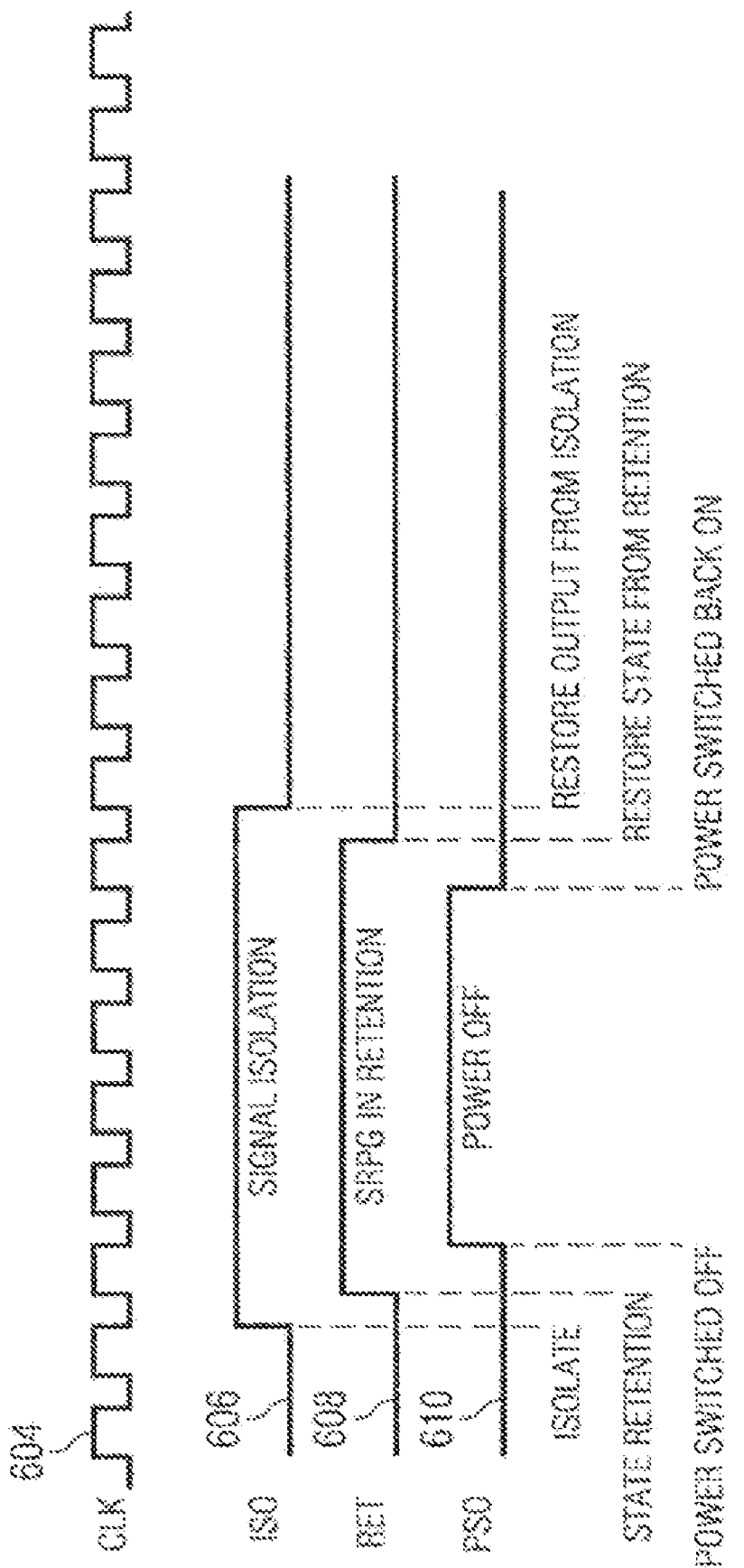
FIG. 6B is an exemplary timing scenario using power signals output from the exemplary power controller of FIG. 6A.

In FIG. 6B, an exemplary timing scenario using the power signals output from the power controller of FIG. 6A is illustrated. FIG. 6B shows the timing sequence for a power-down cycle and a power-up cycle. The timing sequence illustrates that the ISO 606 signal must be active before the power shut-off signal, PSO 610, and hold steady during PSO 610. During the power-down cycle, when PSO 610 is active high, the power assertions may check the ISO 606 and RET 608 signals for glitches and/or proper function. An example of proper functioning could be that the ISO 606 and RET 608 power signals should be active high and remain active high during PSO 610. An active high RET 608 signal may provide one indication that the state retention power gating circuitry used in a design is in retention, or has retained values. Upon power up, PSO 610 goes low, and depending on the instructions, the RET 608 signal may go low to enable the return of a retained value and the ISO 606 signal may stay high to allow continued isolation of certain design modules.

Power assertions may also continue to check the power signals for glitches. The power assertions generated by APAG would also specify and check the number of clocks between all combinations of control signals for power-up and power-down. For example, one assertion could specify a requirement for 4 clock cycles between isolation and power-down. Another assertion could specify a requirement of between 4 and 26 clocks between power-up and power-down. Additionally, in some embodiments, different parts of a design may power up at different time periods. The power assertions generated would check that the different parts of the design would power up correctly in a determined order.

Figure 7:
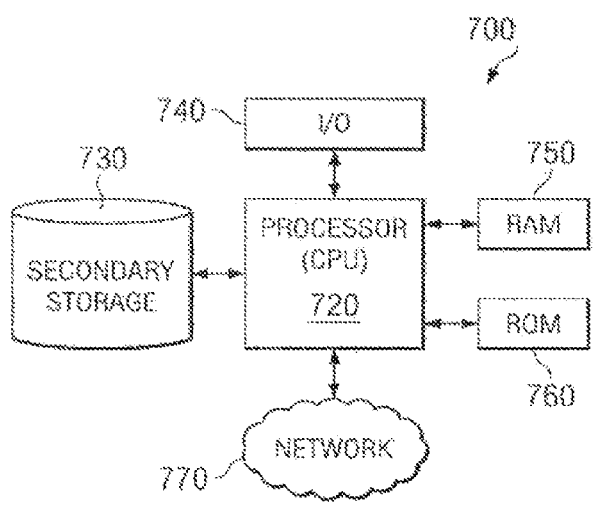
FIG. 7 is a block diagram of an exemplary software environment that may be operable for various embodiments of the disclosure.

The method described herein may be implemented on any general-purpose computer with sufficient processing power, memory resources, and network throughput capability. FIG. 7 illustrates a general-purpose computer system suitable for implementing the embodiments disclosed herein. The computer system 700 includes a central processing unit (CPU) 720, in communication with memory devices including secondary storage 730, random access memory (RAM) 750, read only memory (ROM) 760, input/output (I/O) devices 740, and network connectivity devices 770. The processor 720 may be multi-threaded, or may be implemented as multiple CPU devices.

The CPU 720 executes instructions, codes, computer programs, scripts, which it may access from RAM 750, ROM 760, computer readable media such as hard disk, floppy disk, optical disk, or other secondary storage media 730, or other network connectivity devices. Other computer systems and/or products may include a hardware accelerator or other type of processing system that would well-known to one of ordinary skill in the art.

I/O 740 devices may include printers, video monitors, liquid crystal displays (LCDs), touch screen displays, keyboards, keypads, switches, dials, track balls, voice recognizers, card readers, paper tape readers, or other well-known devices. The network connectivity 770 devices may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA) and/or global system for mobile communications (GSM) radio transceiver cards, and other well-known network devices. These network connectivity 770 devices may enable the processor 720 to communicate with an Internet or one or more intranets. With such network connections, it is contemplated that the processor 720 might receive information from the network, or might output information to the network in the course of performing the method of the disclosure. Such information, which is often represented as a sequence of instructions to be executed using processor 720, may be received from and outputted to the network in the form of a computer data signal embodied in a carrier wave.

Such information, which may include data or instructions to be executed using processor 720, for example, may be received from or outputted to a network, for example, in the form of a computer data baseband signal or signal embodied in a carrier wave. The baseband signal or signal embodied in a carrier wave generated by the network connectivity devices 770 may propagate in or on the surface of electrical conductors, in coaxial cables, in waveguides, in optical media, or in the air or free space.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various methods, techniques or elements may be combined or integrated in another system or certain features may be omitted or not implemented. More specifically, the methods and techniques disclosed herein may be applicable to a small IP block or a large system-on-chip (SOC). Additionally, the methods and techniques disclosed herein may be applied to a design with multiple processors or to a small part of a design that does not have a processor.

Also, techniques, systems, subsystems and methods described and illustrated in the various embodiments as discrete or separate may be combined or integrated with other systems, modules, techniques or methods without departing from the scope of the present disclosure. Other examples of modifications, variations, substitutions, and alterations will be recognizable by one skilled in the art and could be made without departing from the spirit and scope disclosed herein.

Modifications and Variations

As will be recognized by those skilled in the art, the innovative concepts described in the present disclosure can be modified and varied over a tremendous range of applications, and accordingly the scope of patented subject matter is not limited by any of the specific exemplary teachings given. The scope of patented subject matter is intended to embrace all such alternatives, modifications and variations that fall within the spirit and broad scope of the appended claims.

For example, one notable variation could be that the synthesis engine may format the output assertions in various types of languages, including, but in no way limited to languages such as SystemVerilog (SVA) or Property Specification Language (PSL), as indicated previously. Another notable variation may involve the format of the low power specification which should not be limited to any particular format or language.

Further, none of the description in the present disclosure should be read as implying that any particular element, act, or function is an essential element which must be included in the claim scope: The scope of patented subject matter is defined only by the claims. Moreover, none of these claims are intended to invoke paragraph six of 35 U.S.C. §112 unless the exact words "means for" are followed by a participle.

The claims, as filed, are intended to be as comprehensive as possible, and no subject matter is intentionally relinquished, dedicated, or abandoned.

What is claimed is:

1. A computer-implemented method of low power design verification, the method comprising:
    parsing a file which includes statements of low power intent for a low power design;
    using a computer to automatically synthesize assertions for monitoring and checking control signals from the statements of low power intent; and
    verifying low power design behavior using said automatically synthesized assertions.

2. The computer-implemented method of claim 1, wherein the statements of low power intent include power consumption criteria.

3. The computer-implemented method of claim 1, wherein the automatically synthesized assertions are selected from the group consisting of temporal, logical, and Boolean assertions that are triggered by values of the low power design behavior and correspond to verification errors.

4. The computer-implemented method of claim 1, wherein verifying low power design behavior includes checking functionality and transitions of the low power design by simulating the low power design and using the assertions to check values from the simulated low power design.

5. The computer-implemented method of claim 1, wherein the statements of low power intent are in a predefined format.

6. The computer-implemented method of claim 1, wherein verifying includes verifying power dependence relations in a design using said automatically synthesized assertions.

7. The computer-implemented method of claim 1, wherein parsing includes analyzing a power specification to determine the low power behavior of an RTL design; and extracting portions of the power specification in accordance with keywords found therein.

8. The computer-implemented method of claim 7, wherein automatically synthesizing includes automatically synthesizing power assertions based on the keywords extracted.

9. The computer-implemented method of claim 7, wherein the power specification implements a power-aware format.

10. The computer-implemented method of claim 9, wherein the power-aware format is a common power format (CPF).

11. The computer-implemented method of claim 1, wherein verifying the low power design behavior includes:
    simulating an operational sequence that includes a power-up operation and a power-down operation, and
    using said automatically synthesized assertions to evaluate the simulated operational sequence.

12. A computer program product for a circuit design process, including a non-transient medium storing executable program code, the computer program product comprising code, which when executed, performs a computer-implemented method of low power design verification, the method comprising:
    parsing a file which includes statements of low power intent for a low power design;
    using a computer to automatically synthesize assertions for monitoring and checking control signals from the statements of low power intent; and
    verifying low power design behavior using said automatically synthesized assertions.

13. The computer program product of claim 12, wherein the automatically synthesized assertions are selected from the group consisting of temporal, logical, and Boolean assertions that are triggered by values of the low power design behavior and correspond to verification errors.

14. The computer program product of claim 12, wherein verifying low power design behavior includes checking functionality and transitions of the low power design by simulating the low power design and using the assertions to check values from the simulated low power design.

15. The computer program product of claim 12, wherein parsing includes analyzing a power specification to determine the low power behavior of an RTL design; and extracting portions of the power specification in accordance with keywords found therein.

16. The computer program product of claim 12, wherein verifying the low power design behavior includes:
    simulating an operational sequence that includes a power-up operation and a power-down operation, and
    using said automatically synthesized assertions to evaluate the simulated operational sequence.

17. A method of validating implementation aspects of a low power specification, the method comprising:
    detecting implementation requirements for an operational sequence of control signals in a low power specification;
    using a computer to automatically construct a checker which corresponds to the implementation requirements, wherein the checker monitors values for the operational sequence and evaluates assertions that correspond to verification errors in the operational sequence; and
    verifying the implementation requirements by executing said checker, wherein verifying the implementation requirements includes at least one of
    checking power retention states and level shifters in the operational sequence, or
    checking power-up and power-down sequences in the operational sequence.

18. The method of validating of claim 17, wherein the implementation requirements relate to constraint, yield and power.

19. The method of validating of claim 17, wherein the checker is written in an assertion language.

20. The method of validating of claim 19, wherein the assertion language is SystemVerilog.

21. The method of validating of claim 19, wherein the assertion language is property specification language (PSL).

22. The method of validating of claim 17, wherein verifying the implementation requirements includes checking physical implementation requirements for the operational sequence.

23. The method of validating of claim 17, wherein verifying the implementation requirements includes checking variations in power networks and power domains in the operational sequence.

24. The method of validating of claim 17, wherein verifying the implementation requirements includes checking power retention states and level shifters in the operational sequence.

25. The method of validating of claim 17, wherein verifying the implementation requirements include checking power-up and power-down sequences in the operational sequence.

26. A computer program product for a circuit design process, including a non-transient medium storing executable program code, the computer program product comprising code, which when executed, performs a method of validating implementation aspects of a low power specification, the method comprising:
  detecting implementation requirements for an operational sequence of control signals in a low power specification;
  using a computer to automatically construct a checker which corresponds to the implementation requirements, wherein the checker monitors values for the operational sequence and evaluates assertions that correspond to verification errors in the operational sequence; and
  verifying the implementation requirements by executing said checker, wherein verifying the implementation requirements includes at least one of
    checking power retention states and level shifters in the operational sequence, or
    checking power-up and power-down sequences in the operational sequence.

27. A system for low power design verification, comprising:
  means for parsing a file which includes a statement of low power intent for a low power design;
  means for automatically synthesizing power assertions for monitoring and checking control signals in a low power design from the statement of power intent; and
  means for verifying control and power mode relations in the low power design by using said synthesized power assertions to evaluate a behavior of the low power design.

28. The system of claim 27, wherein the automatically synthesized assertions are temporal expressions that correspond to operational sequences of the control signals.

29. The system of claim 27, wherein the automatically synthesized assertions are selected from the group consisting of temporal, logical, and Boolean assertions that are triggered by values of the low power design behavior and correspond to verification errors.

* * * * *

UNITED STATES PATENT AND TRADEMARK OFFICE
CERTIFICATE OF CORRECTION

PATENT NO. : 7,958,475 B2  
APPLICATION NO. : 11/863512  
DATED : June 7, 2011  
INVENTOR(S) : Neyaz Khan Page 1 of 1

It is certified that error appears in the above-identified patent and that said Letters Patent is hereby corrected as shown below:

In column 8, line 23, delete "PwrAstr" and insert -- PwrAsrt --, therefor.

In column 8, line 27, delete "PwrAstr" and insert -- PwrAsrt --, therefor.

Signed and Sealed this
Ninth Day of August, 2011

David J. Kappos
*Director of the United States Patent and Trademark Office*